United States Patent
Hall et al.

[19]

[11] Patent Number: 6,037,618
[45] Date of Patent: Mar. 14, 2000

[54] INTERGRATED FIELD EFFECT TRANSISTOR DEVICE FOR HIGH POWER AND VOLTAGE AMPLIFICATION OF RF SIGNALS

[75] Inventors: John H. Hall; J. Kirkwood H. Rough, both of San Jose, Calif.

[73] Assignee: Linear Integrated Systems, Inc., Fremont, Calif.

[21] Appl. No.: 09/024,821

[22] Filed: Feb. 17, 1998

[51] Int. Cl.[7] .......................... H01L 29/80; H01L 31/112
[52] U.S. Cl. ............................................................ 257/263
[58] Field of Search .............................................. 257/263

[56] References Cited

FOREIGN PATENT DOCUMENTS

| | | |
|---|---|---|
| 2833068 | 2/1979 | Germany . |
| 52-58483 | 5/1977 | Japan . |

OTHER PUBLICATIONS

Sedra et al, Microelectronic Circuits, pp 320–321, © 1987.

*Primary Examiner*—Stephen D. Meier
*Attorney, Agent, or Firm*—Townsend and Townsend and Crew LLP; Henry K. Woodward

[57] ABSTRACT

An integrated transistor device operates with a linear triode vacuum tube like characteristic with a very low output impedance and a large interaction between the gate and drain potentials. The drain current of a first transistor is connected directly to the source of a second transistor which has a low input impedance matching the output impedance of the first transistor. The gate of the second transistor is held at a positive potential and functions to provide isolation of the varying drain signal from the drain of the first transistor and to provide a high impedance at the output terminal. This device structure provides high input impedance, high current gain, high output impedance and a linear operating characteristic.

8 Claims, 3 Drawing Sheets

6,037,618

INTERGRATED FIELD EFFECT TRANSISTOR DEVICE FOR HIGH POWER AND VOLTAGE AMPLIFICATION OF RF SIGNALS

BACKGROUND OF THE INVENTION

This invention relates generally to high operating voltage, power, and radio frequency signal amplification, and more particularly the invention relates to a four terminal junction field effect transistor device which exhibits linear rather than square law electrical characteristics with an improved output impedance which allows a higher voltage gain than prior art devices.

High power capability junction field effect transistors have been proposed and patented since the early 1960's. Many of these have followed the Stanislas Teszner design (U.S. Pat. No. 3,274,461) or the Rainer Zuleeg design (U.S. Pat. No. 442,079). These designs have produced products with good performance to frequencies of 500 mega hertz and poor performance (low power gains) up to 1 to 2 giga hertz. The major limitations of the devices are their very low output impedance, low and non linear voltage gains, and a relatively large reverse transadmittance, which reduces the input impedance at high frequencies thereby reducing the achievable power gain at high frequencies (e.g. in the 1 to 5 giga hertz region).

The present invention is directed to modifying a vertical field effect structure to include an additional gate and drain structure which isolates the drain and output electrode from the input gate in a way similar to the action of the screen grid of a tetrode vacuum tube as it acts to isolate the plate signal of a triode from the control grid. The result of adding this additional gate/drain section to the device is a much improved power and voltage gain and a large reduction in reverse transadmittance, which greatly extends the frequency of operation. A second feature is that the linear voltage gain operating characteristic is retained while converting the device characteristics from that of a triode to that of a pentode vacuum tube. The structure of the device is a planar, dielectrically isolated, two lateral section vertical junction field effect transistor. The first section is a vertical JFET with a source gate and drain electrode which is electrically isolated from the second transistor section. The second section comprises a source gate and drain in which the gate and drain are electrically isolated from the first section except the first section drain is connected to the second section source. This results in a four electrode device composed of a source, gate, screen gate and drain, and having the electrical characteristics of a vacuum tube pentode with greatly improved current gain and current handling capabilities as well as improved frequency response.

SUMMARY OF THE INVENTION

Accordingly an object of the invention is an integrated transistor structure having improved operating frequencies.

Another object of the invention is a vertical field effect transistor utilizing vertical field effect transistor action in conjunction with a screen gate between the first drain and a second drain to reduce the interaction between the first gate and the second drain and increase band width and power gain.

A feature of the invention is the use of silicon dioxide trench isolation to electrically isolate the first gate and source area from the second gate and drain area to eliminate any electrical interaction between the various elements.

Briefly, in a preferred embodiment two isolated islands are formed in an monocrystalline semiconductor substrate utilizing a moat etch silicon oxide dielectric isolation and poly crystal silicon and bonded wafer techniques to form two adjacent electrically isolated pockets of silicon. The periphery of the pockets is surrounded by a high concentration N+silicon layer (on the order of $10^{20}$ atoms per cubic centimeter), which extends to the top surface of the pocket, the bulk of the pocket which forms the drain region is a layer of silicon doped to an N type concentration of (on the order of $10^{15}$ atoms per cubic centimeter), such as an epitaxial layer formed on a supporting substrate, The gate region, which surrounds the source region and is doped P type, is diffused from the top surface and has a dopant concentration (on the order to $10^{19}$ atoms per cubic centimeters), and a depth of approximately 2 micron. The source region is doped N+ type and is diffused from the top surface and has a dopant concentration (on the order of $10^{22}$ per cubic centimeter and a depth of approximately 1 micron).

After the formation of the epitaxial layer the oxide isolated tubs are formed and two vertical junction field effect transistors are formed in these tubs. An interconnection of these two transistors and contacts to the devices are formed by the aluminum metallization which connect the drain of the first transistor to the source of the second transistor. The second transistor having a geometry slightly different from the first transistor in order to change its operating bias point.

In operation the first transistor operates as a vertical junction field effect transistor with a linear triode operating characteristic. However, when the source of the second transistor is connected to the drain of the first transistor the load impedance presented by the second transistor is only two to five ohms. While the linear current gain of the first transistor is retained, the voltage gain at the drain of this transistor is reduced to virtually zero. Under these conditions the current flowing in the first transistor becomes the same value as the current flowing in the second transistor. As the current passes through the second transistor the impedance level at the second drain increases from its 5 ohm value at the first drain to over 500 ohms at the second drain and a large voltage gain can be obtained at the output terminal of the second drain. While this happens the gate of the second transistor is held at a fixed voltage, which causes the gate to isolate the output signal swings from the drain and gate of the first transistor. By eliminating the interaction of the first gate and first drain, the band width is increased until limited by the time constant of the first gate and first source which represents an approximately 10 to 20 giga hertz band width.

Since the vertical junction field effect transistors support operations at high voltages (of 100 to 200 volts) and high currents (0.1 to 2 amp) significant radio frequency power levels can be produced by these devices. Also the voltage and current gains of this device are linear rather than square law as in the case of bipolar of Mos, devices. This feature eliminates unwanted harmonic signal generation when these parts are used as radio frequency power amplifiers.

The invention and objects and features thereof will be more readily apparent from the following detailed description and appended claims when taken with the drawings.

DESCRIPTION OF THE ILLUSTRATIVE EMBODIMENTS

FIGS. 1A–1E illustrate steps in fabricating an integrated transistor device in accordance with the invention the steps involve know semiconductor processing steps.

Figure 1A:
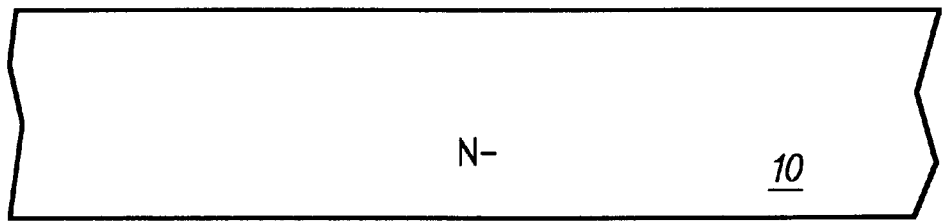
FIGS 1A–1E illustrate steps in fabricating an integrated transistor device in accordance with the invention.

In FIG. 1A, an N-doped monocrystalline substrate 10, which can include an N-epitaxial layer 10 on a monocrystalline silicon substrate, has a dopant concentration on the order of $10^{15}$ atoms per cubic centimeter.

Figure 1B:
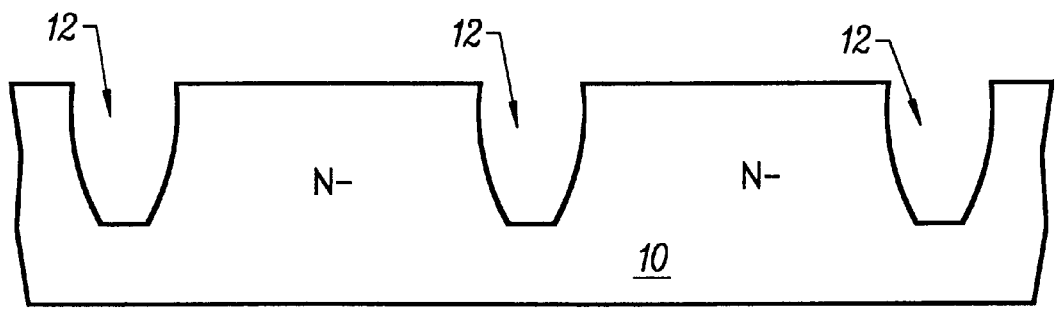
Figure 1C:
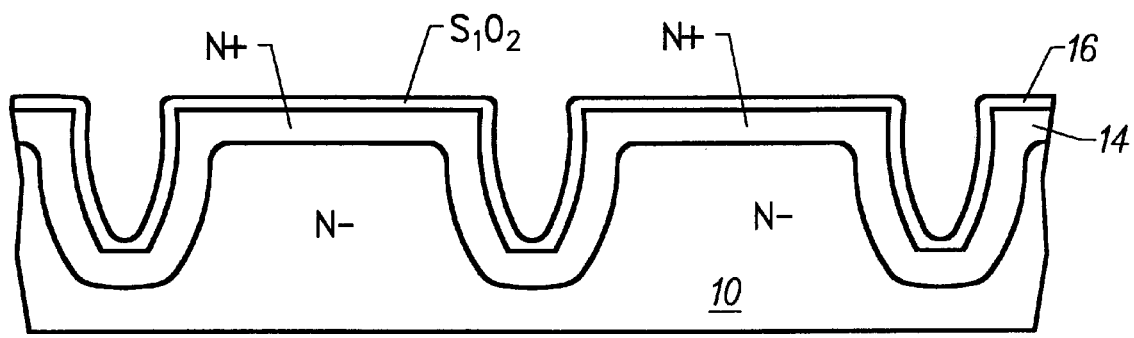

In FIG. 1B, grooves 12 are etched into substrate 10 or through an epitaxial layer, if used. Thereafter, as shown in FIG. 1C, a heavily doped N+ region 14 (e.g. $10^{22}$ atoms per cubic centimeter) is formed in the surface of substrate 10 including the grooves 12. A silicon oxide layer 16 is then thermally grown on the surface of the N+ layer 14 to a thickness of approximately on micron.

Figure 1D:
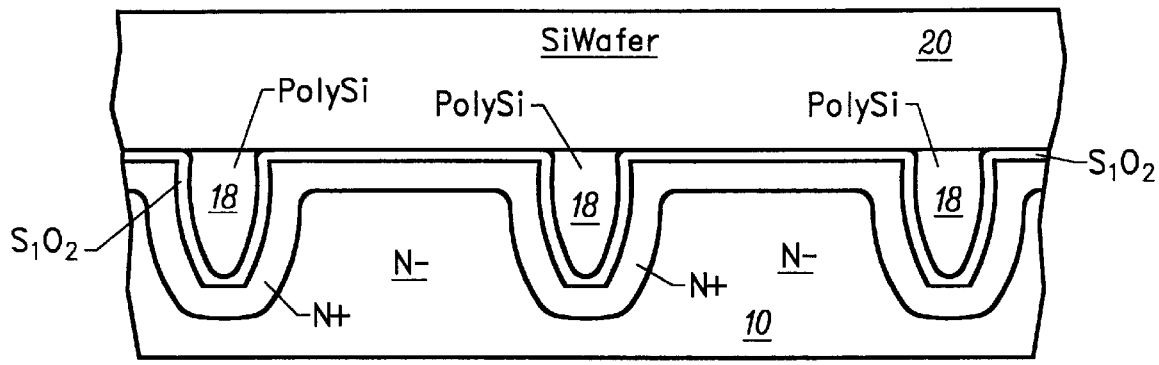

Thereafter, as shown in FIG. 1D the grooves are filled with polycrystalline silicon (polysilicon) 18. The surface is lapped flat and then bonded to a support silicon substrate 20. The silicon wafer 10 is then removed by lapping until only the monocrystalline silicon pockets 10 in silicon oxide electrically isolated tubs remain on the supporting substrate 20, as shown in FIG. 1E.

Figure 1E:
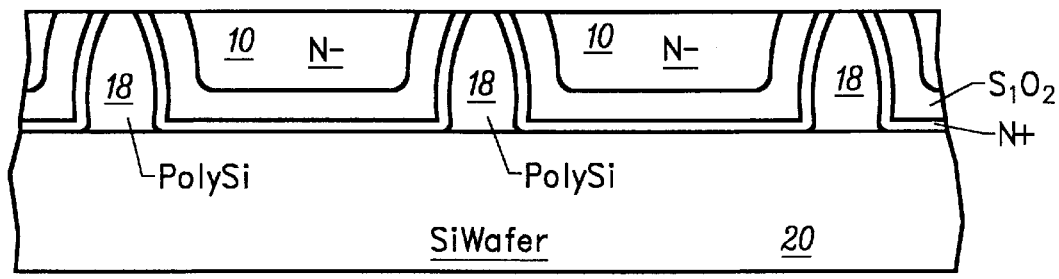
Figure 2:
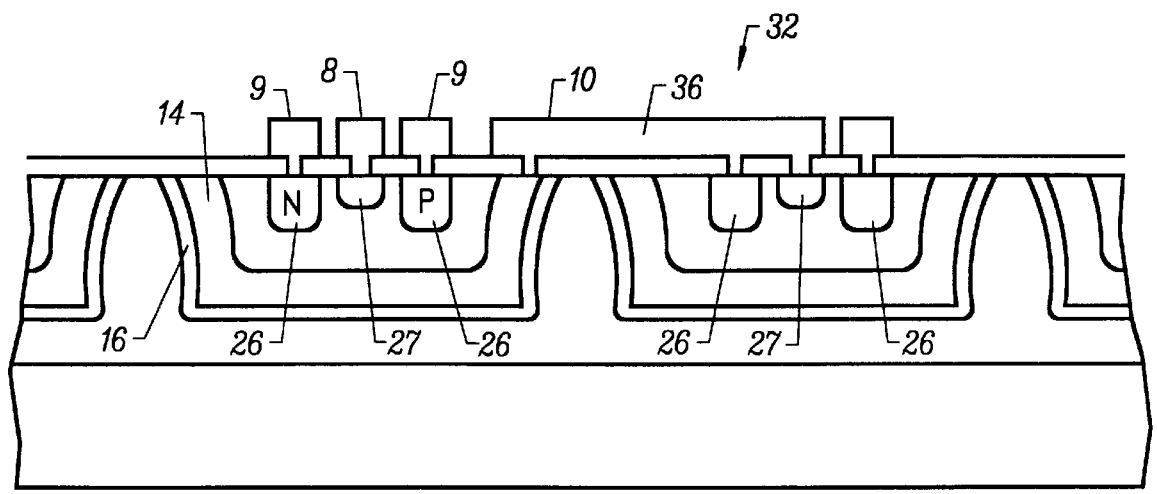
FIG. 2 is a section view of a vertical junction FET transistor device fabricated in accordance with the present invention.
Figure 3:
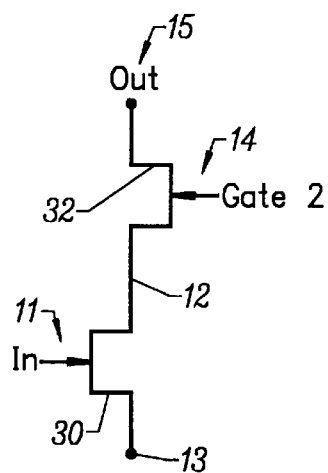
FIG. 3 is a schematic diagram of the FET transistor device of FIG. 2.

The finished device, as shown in the cross-section of FIG. 2, is then fabricated in the pockets 10 of FIG. 1E.

An oxide layer of 5 to 7000 angstroms is first formed on the top surface, and then apertures are formed in the oxide using standard lithographic processes. The first apertures being a combination of the gate 26 and source 27 patterns in order to form a self aligned structure in which the gate and the source are self aligned to each other, The gate aperture is about one point five microns in length and about 250 microns in width. The gates are spaced two microns away from the 1.5 micron source 8 and circularly surround the source 8. In each of the two devices there are about 40 sources to provide an operating current of 250 to 400 milliampere of operating current. The gate and source apertures are etched into the silicon oxide layer and then in a second masking step the source apertures are covered over by photo resist to protect them from the ion implant dose of boron of approximately $5 \times 10^{15}$ at an energy 60 kilo volts. After the boron ion implantation into the gate region, the source photo resist is removed and the boron implant is diffused to about 2 microns deep to form the gate region which has a concentration of about $1 \times 10^{19}$ atoms per cubic centimeter. The gate apertures are then covered with photo resist, and the source and drain areas are implanted with Arsenic 5E 1 5–120 KEV and Phosphorous 5E 1 5–120 KEV to reach a source concentration of about $10^{20}$ atoms per cubic centimeter. The source is then diffused to a depth of one micron at a temperature of 1,000 Degrees C. for a time of 30 minutes. The source, gate and drain contacts are then opened and metallized to form the electrical structure shown schematically in FIG. 2.

The resulting integrated transistor device includes field effect transistors 30, 32 each formed in an electrically isolated pocket with the drain 14 of transistor 30 electrically connected by aluminum metallization 36 to the source 27 of transistor 32. The vertical junction field effect transistors support operations at high voltages (of 100 to 200 volts) and high currents (0.1 to 2 amp), and significant radio frequency power levels can be produced by these devices. Also the voltage and current gains of the integrated transistor device are linear rather than square law as in the case of bipolar or Mos devices. This feature eliminates unwanted harmonic signal generation when these parts are used as radio frequency power amplifiers.

While the invention has been described with reference to one embodiment, the description is illustrative of the invention and is not to be construed as limiting the invention. Various modifications and applications may occur to those skilled in the art without departing from the true spirit and scope of the invention as defined by the appended claims.

What is claimed is:

1. An integrated field effect transistor device for high voltage and power amplification of RF signals comprising
   a) a supporting substrate,
   b) first and second semiconductor pockets on said supporting substrate in electrically isolated tubs,
   c) a first field effect transistor formed in said first pocket and including a source and a drain with a first gate therebetween,
   d) a second field effect transistor formed in said second pocket and including a source and a drain with a second gate therebetween, and
   e) an electrical interconnect connecting the drain of the first transistor to the source of the second transistor, whereby the first gate functions as an input terminal and the second gate functions as a screen grid terminal in isolating the drain output of the second field effect transistor from first gate input terminal.

2. The device as defined by claim 1 wherein each pocket is covered with a dielectric.

3. The device as defined by claims 2 wherein said dielectric is silicon oxide.

4. The device as defined by claim 3 wherein the first and second field effect transistors are vertical field effect transistors with the gates surrounding the sources.

5. The device as defined by claim 4 wherein each source is doped N type, and each gate is doped P type, the drains extending deeper into each pocket than sources.

6. The as defined by claim 5 wherein each drain comprises a heavily doped N region abutting the silicon oxide.

7. The as defined by claim 6 wherein the sources are doped on the order of $10^{20}$ atoms per cubic centimeter, the gates are doped on the order of $10^{19}$ atoms per cubic centimeter, and the heavily doped regions of the drains are doped on the order of $10^{21}$ atoms per cubic centimeter.

8. The device as defined by claim 5 wherein the second gate receives a positive bias voltage.

\* \* \* \* \*